United States Patent
Park et al.

(10) Patent No.: US 10,304,687 B2
(45) Date of Patent: May 28, 2019

(54) SUBSTRATE TREATING APPARATUS AND SUBSTRATE TREATING METHOD

(71) Applicant: SEMES CO., LTD., Chungcheongnam-do (KR)

(72) Inventors: Soyoung Park, Gyeongsangnam-do (KR); Heehwan Kim, Sejong-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/655,055

(22) Filed: Jul. 20, 2017

(65) Prior Publication Data
US 2018/0033632 A1    Feb. 1, 2018

(30) Foreign Application Priority Data

Jul. 29, 2016  (KR) .......... 10-2016-0096872

(51) Int. Cl.
| | | |
|---|---|---|
| B08B 3/02 | (2006.01) | |
| B08B 3/04 | (2006.01) | |
| B08B 3/08 | (2006.01) | |
| B08B 3/10 | (2006.01) | |
| H01L 21/02 | (2006.01) | |
| H01L 21/67 | (2006.01) | |
| H01L 21/304 | (2006.01) | |
| H01L 21/687 | (2006.01) | |

(52) U.S. Cl.
CPC .............. *H01L 21/304* (2013.01); *B08B 3/02* (2013.01); *B08B 3/047* (2013.01); *B08B 3/08* (2013.01); *B08B 3/10* (2013.01); *H01L 21/67051* (2013.01); *H01L 21/02057* (2013.01); *H01L 21/6708* (2013.01); *H01L 21/67028* (2013.01); *H01L 21/68764* (2013.01)

(58) Field of Classification Search
CPC ......... H01L 21/67051; H01L 21/67028; H01L 21/6708; H01L 21/68764; H01L 21/02057; H01L 21/6715
See application file for complete search history.

(56) References Cited

U.S. PATENT DOCUMENTS

| | | | | |
|---|---|---|---|---|
| 2017/0098538 | A1* | 4/2017 | Nakai | H01L 21/67051 |
| 2017/0170021 | A1* | 6/2017 | Hoshino | C23C 18/1879 |
| 2017/0316961 | A1* | 11/2017 | Nakamori | H01L 21/304 |
| 2017/0372922 | A1* | 12/2017 | Jung | H01L 21/6715 |

FOREIGN PATENT DOCUMENTS

| | | |
|---|---|---|
| JP | 2006-093497 A | 4/2006 |
| JP | 2014-150136 A | 8/2014 |
| JP | 2016-072613 A | 5/2016 |
| KR | 1020150002430 | 1/2015 |
| KR | 1020160015901 A | 2/2016 |

* cited by examiner

Primary Examiner — Jaehwan Oh
Assistant Examiner — John M Parker
(74) Attorney, Agent, or Firm — Li & Cai Intellectual Property (USA) Office

(57) ABSTRACT

Disclosed is a substrate treating apparatus. The substrate treating apparatus includes a spin head configured to support the substrate, a cup surrounding an outer circumference of the spin head, a first ejection member having a first nozzle configured to discharge a first chemical to the substrate located in the spin head, and a second ejection member having a second nozzle configured to discharge a second chemical of the same chemical composition as that of the first chemical to the substrate located in the spin head.

9 Claims, 5 Drawing Sheets

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2016-0096872 filed Jul. 29, 2016, in the Korean Intellectual Property Office, the entire contents of which are hereby incorporated by reference.

BACKGROUND

Embodiments of the inventive concept described herein relate to a substrate treating apparatus and a substrate treating method.

In general, a semiconductor device is manufactured by depositing various materials on a substrate in forms of thin films and patterning the deposited materials. To achieve this, different processes of several stages, such as a deposition process, a photographing process, an etching process, and a cleaning process are required.

Among them, the etching process is a process of removing the film formed on the substrate, and the cleaning process is a process of removing contaminants residing on a surface of the substrate after unit processes for manufacturing the semiconductor device are performed. The etching process and the cleaning process are classified into a wet type and a dry type according to process executing methods, and the wet type is classified into a batch type and a spin type.

In the spin type, a substrate is cleaned by supplying a chemical or deionized water to a substrate through an ejection nozzle while the substrate is rotated after fixing the substrate to a chuck member that may treat one substrate, and by spreading the chemical or the deionized water to the entire surface of the substrate by using a centrifugal force.

SUMMARY

Embodiments of the inventive concept provide a substrate treating apparatus that may efficiently treat a substrate, and a substrate treating method.

Embodiments of the inventive concept also provide a substrate treating apparatus that may uniformly treat an inside and an outside of a substrate, and a substrate treating method.

Embodiments of the inventive concept also provide a substrate treating apparatus that may reduce an amount of a chemical consumed in treating a substrate, and a substrate treating method.

The objects of the inventive concept are not limited to the above-described ones. Other technical objects that are not mentioned will be clearly understood from the following description by those skilled in the art to which the inventive concept pertains.

In accordance with an aspect of the inventive concept, there is provided a substrate treating apparatus including a spin head configured to support the substrate, a cup surrounding an outer circumference of the spin head, a first ejection member having a first nozzle configured to discharge a first chemical to the substrate located in the spin head, and a second ejection member having a second nozzle configured to discharge a second chemical of the same chemical composition as that of the first chemical to the substrate located in the spin head.

The first nozzle may discharge the first chemical while being located above the center of rotation of the substrate.

The first nozzle may discharge the first chemical while moving in an area that is inside a half of the radius of the substrate.

The first nozzle may pass above the center of rotation of the substrate.

The second nozzle may discharge the second chemical while being located an area that is outside a half of the radius of the substrate.

The second nozzle may discharge the second chemical while moving between an area corresponding to a half of the radius of the substrate and an outer end of the substrate.

A concentration of the second chemical is higher than that of the first chemical.

A temperature of the second chemical is higher than that of the first chemical.

The substrate treating apparatus may further include a tank. The first nozzle may be connected to the tank through a first pipeline. The second nozzle may be connected to the tank through a second pipeline.

A heater is located in the second pipeline.

The substrate treating apparatus may further include an auxiliary tank, and the auxiliary tank may be connected to the first pipeline through an auxiliary pipeline.

The substrate treating apparatus may further include a first tank and a second tank, the first nozzle may be connected to the first tank through a first pipeline, and the second nozzle may be connected to the second tank through a second pipeline.

In accordance with another aspect of the inventive concept, there is provided a substrate treating method including locating a substrate in a spin head, and while discharging a first chemical though a first nozzle, discharging a second chemical having the same chemical composition as that of the first chemical through a second nozzle.

The first nozzle may discharge the first chemical to an area that is inside a half of the radius of the substrate, and the second nozzle may discharge the second chemical to an area that is outside a half of the radius of the substrate.

The first nozzle may discharge the first chemical while being stopped above the center of rotation of the substrate, and the second nozzle may discharge the second chemical while being stopped at one point corresponding to an area that is outside a half of the radius of the substrate.

The first nozzle may discharge the first chemical while moving in an area that is inside a half of the radius of the substrate, and the second nozzle may discharge the second chemical while being stopped in one point correspond to an area that is outside a half of the radius of the substrate.

A concentration of the second chemical may be higher than that of the first chemical.

A temperature of the second chemical may be higher than that of the first chemical.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof FIG. 1 is a plan view illustrating a substrate treating system according to the inventive concept.

Figure 1:
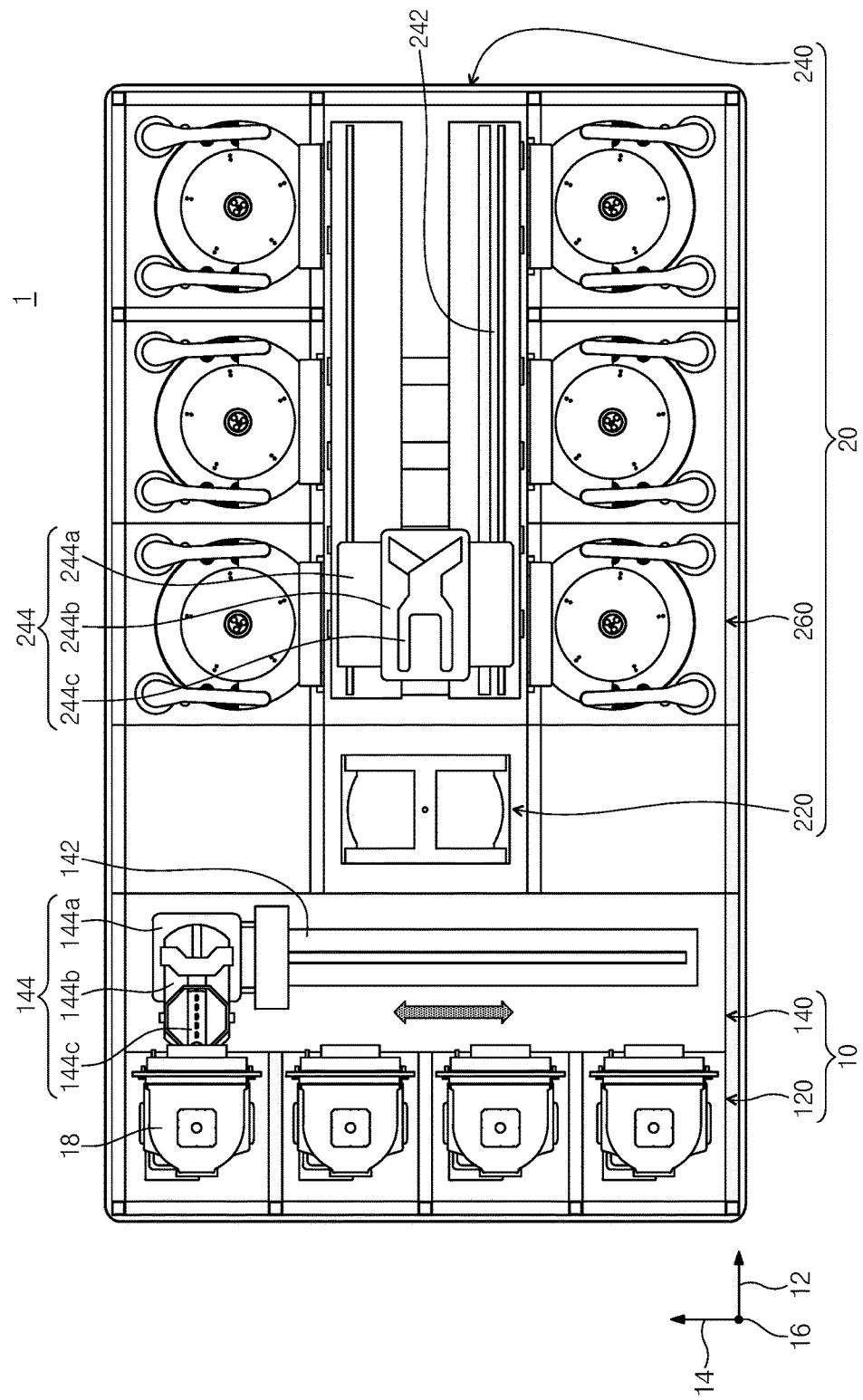
FIG. 1 is a plan view illustrating a substrate treating system according to the inventive concept.

Referring to FIG. 1, the substrate treating system 1 includes an index module 10 and a process executing module 20.

The index module 10 includes a plurality of load ports 120 and a feeding frame 140. The load port 120, the feeding frame 140, and the process executing module 20 may be sequentially arranged. Hereinafter, a direction in which the load port 120, the feeding frame 140, and the process executing module 20 will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are disposed along the second direction 14 in a row. FIG. 1 illustrates that four load ports 120 are provided. However, the number of the load ports 120 may increase or decrease according to a condition, such as the process efficiency of the process executing module 20 or a footprint. A plurality of slots (not illustrated) provided to support peripheries of substrates W are formed in the carrier 130. A plurality of slots are provided in the third direction 16. The substrates W are stacked in the carrier 130 while being spaced apart from each other along the third direction 16. A front opening unified pod (FOUP) may be used as the carrier 130.

The process executing module 20 includes a buffer unit 220, a feeding chamber 240, and a plurality of process chambers 260. The feeding chamber 240 is disposed such that the lengthwise direction thereof is in parallel to the first direction 12. The process chambers 260 are disposed on opposite sides of the feeding chamber 240 along the second direction 14. Some of the process chambers 260 are disposed along the lengthwise direction of the feeding chamber 240. Furthermore, some of the process chambers 260 are disposed to be stacked on each other. That is, the process chambers 260 having an array of A by B (A and B are natural numbers) may be disposed on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be disposed in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 located on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 130 in the process module 20, and some of the index arms 155 may be used when the substrates W are transported from the carrier 130 to the process executing module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is disposed such that the lengthwise direction thereof is in parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are disposed to be stacked so as to be spaced apart from each other along the third direction 16. The main arms 244c used when the substrates W are transported from the buffer unit 220 to the process chambers 260 and the main arms 244c used when the substrates W are transported from the process chambers 260 to the buffer unit 220 may be different.

A substrate treating apparatus for treating a substrate W with a chemical is provided in the process chamber 260. The substrate treating apparatuses provided in the process chambers 260 may have different structures according to the types of performed processes. Selectively, the substrate treating apparatuses in the process chambers 260 may have the same structure. Selectively, the process chambers 260 may be classified into a plurality of groups such that the structures of the substrate treating apparatuses in the process chambers 260 pertaining to the same group are the same and the structures of the substrate treating apparatuses in the process chambers 260 pertaining to different groups are different. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of process methods.

Figure 2:
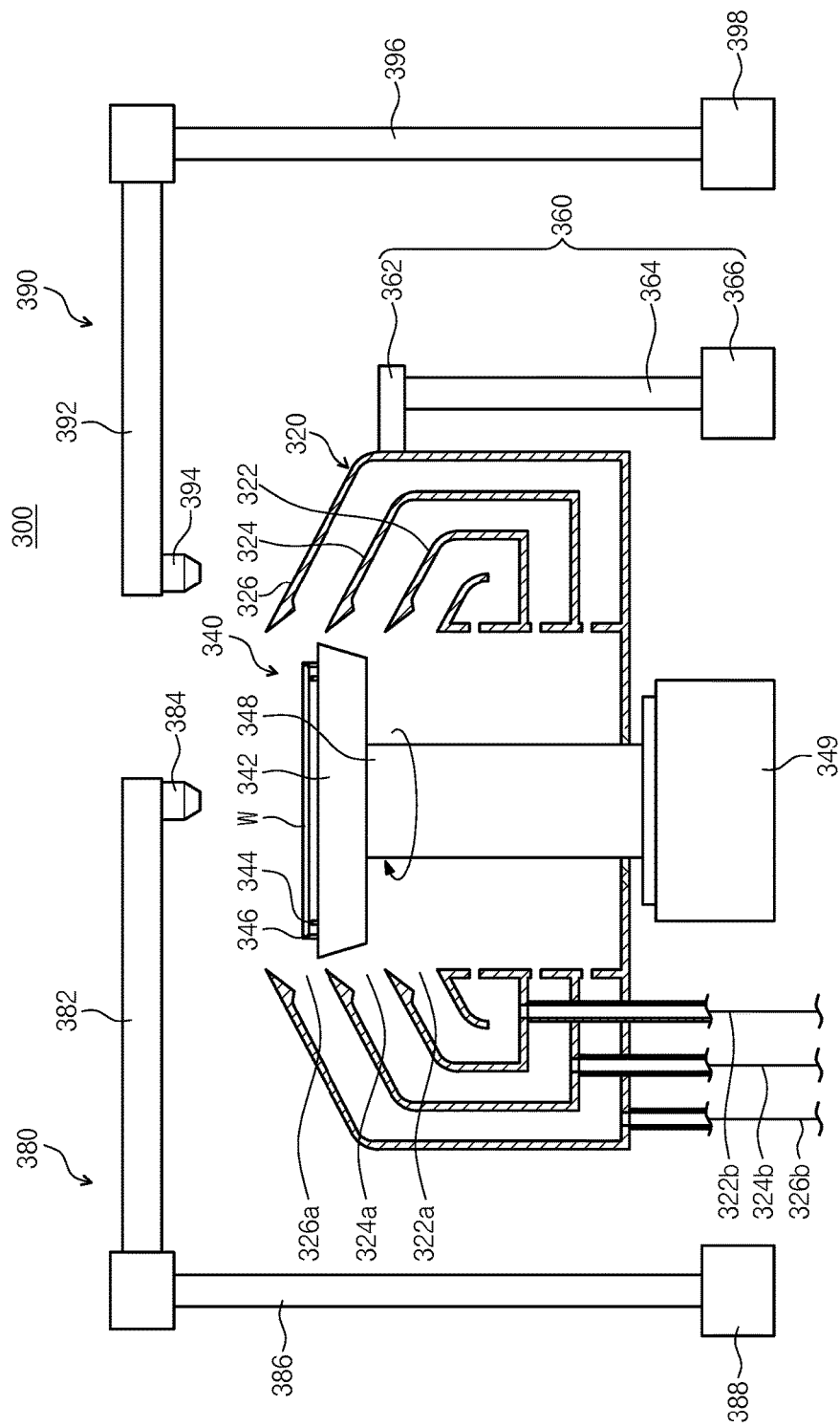
FIG. 2 is a sectional view illustrating an example of a substrate treating apparatus provided one or more of process chambers.

FIG. 2 is a sectional view illustrating an example of a substrate treating apparatus provided one or more of process chambers.

Referring to FIG. 2, the substrate treating apparatus 300 includes a cup 320, a spin head 340, an elevation unit 360, a first ejection member 380, and a second ejection member 390. The cup 320 has a space for performing a substrate treating process, and an upper side of the cup 320 is opened. The cup 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the spin head 340, the intermediate recovery vessel 324 has an annular ring shape that surrounds the inner recovery vessel 322, and the outer recovery vessel 326 has an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets through which the treatment liquids are introduced into the inner recovery vessel 322, the intermediate recovery vessel 324, and the outer recovery vessel 326. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquids introduced through the recovery vessels 322, 324, 326, respectively. The discharged treatment liquids may be reused through an external treatment liquid recycling system (not illustrated).

The spin head 340 is disposed in the cup 320. The spin head 340 supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342. A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance. A plurality of chuck pins 346 are provided. The chuck pins 346 are disposed to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the cup 320 upwards and downwards. When the cup 320 moves upwards and downwards, a relative height of the cup 320 to the spin head 340 is changed. The elevation unit 360 has a bracket 362, a movable shaft 364, and a driver 366. The bracket 362 is fixedly installed on an outer wall of the cup 320, and the movable shaft 364 that is moved upwards and downwards by the driver 366 is fixedly coupled to the bracket 362. The cup 320 is lowered such that, when the substrate W is positioned on the spin head 340 or is lifted from the spin head 340, the cup 320 is lowered such that the spin head 340 protrudes to the upper side of the cup 320. When the process is performed, the height of the cup 320 is adjusted such that the treatment liquid is introduced into the preset recovery vessel 322, 324, 326 according to the kind of the treatment liquid supplied to the substrate W. For example, the substrate W is located at a height corresponding to an interior space 322a of the inner recovery vessel 322 while the substrate W is treated by a first treatment fluid. Further, the substrate W may be located at a height corresponding to a space 324a between the inner recovery vessel 322 and the intermediate recovery vessel 324 and a space 326a between the intermediate recovery vessel 324 and the outer recovery vessel 3265 while the substrate W is treated by a second treatment liquid and a third treatment liquid. Unlike those described above, the elevation unit 360 may move the spin head 340, instead of the cup 320, upwards and downwards.

Figure 3:
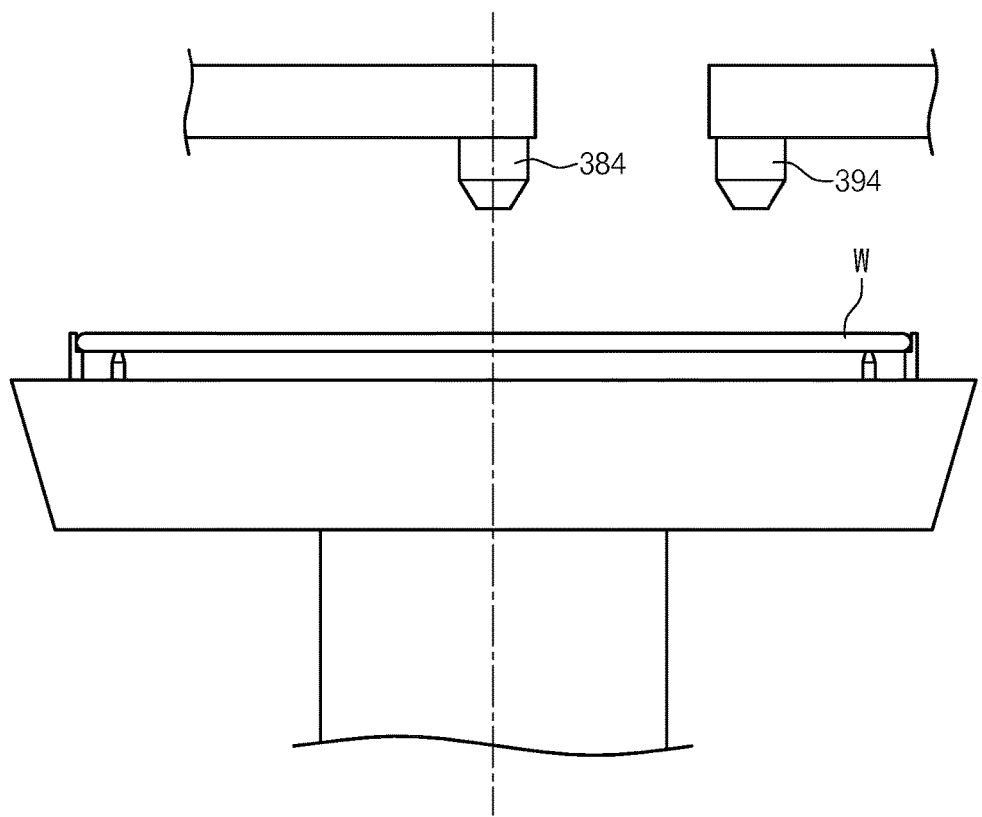
FIG. 3 is a view illustrating a state in which a first ejection member and a second ejection member supply a chemical to a substrate.

FIG. 3 is a view illustrating a state in which a first ejection member and a second ejection member supply a chemical to a substrate.

Referring to FIGS. 2 and 3, the first ejection member 380 has a first nozzle support 382, a first nozzle 384, a first support shaft 386, and a first driver 388. The lengthwise direction of the first support shaft 386 is provided along the third direction 16, and the first driver 388 is coupled to a lower end of the first support shaft 386. The first driver 388 rotates and elevates the first support shaft 386. The first nozzle support 382 is vertically coupled to an end opposite to an end of the first support shaft 386 coupled to the first driver 388. The first nozzle 384 is installed on a bottom surface of an end of one side of the first nozzle support 382. The first nozzle 384 moves to a process location and a standby location by the first driver 388. A process location is a vertically upward area of the spin head 340 such that the first nozzle 384 discharges a first chemical to the substrate W. A standby location is a location that the first nozzle 384 deviates towards an outside of the vertically upward area of the spin head 340.

After the substrate W is located on the spin head 340, the first ejection member 380 supplies the first chemical to a central area of the substrate W that is rotating. As an example, after the first nozzle 384 is moved above the center of rotation of the substrate W, the first ejection member 380 may supply the first chemical to the central area of the substrate W while being stopped. Further, the first ejection member 380 may supply the first chemical to the central area of the substrate W while the first nozzle 384 is moved in a preset interval. Then, a movement path of the first nozzle 384 is provided to pass above the center of rotation of the substrate W. Further, the first nozzle 384 may be moved in an area that is inside a half of the radius of the substrate W from the center of the substrate W. Accordingly, the first ejection member 380 discharges the first chemical to the area that is inside a half of the radius of the substrate W with respect to the center of the substrate W.

After the substrate W is located on the spin head 340, the second ejection member 390 supplies the second chemical to a central area of the substrate W that is rotating. The second chemical has the same chemical composition as that of the first chemical, and the same process is performed on the substrate W. The second ejection member 390 has a second nozzle support 392, a second nozzle 394, a second support shaft 396, and a second driver 398. The lengthwise direction of the second support shaft 396 is provided along the third direction 16, and the second driver 398 is coupled to a lower end of the second support shaft 396. The second driver 398 rotates and elevates the second support shaft 396. The second nozzle support 392 is vertically coupled to an end opposite to an end of the second support shaft 396 coupled to the second driver 398. The second nozzle 394 is installed on a bottom surface of an end of one side of the second nozzle support 392. The second nozzle 394 moves to a process location and a standby location by the second driver 398. A process location is a vertically upward area of the spin head 340 such that the second nozzle 394 discharges the second chemical to the substrate W. A standby location is a location that the second nozzle 394 deviates towards an outside of the vertically upward area of the spin head 340.

The second ejection member 390 discharges the second chemical to an outer area of the area, to which the first ejection member 380 discharges the first chemical. As an example, after the second nozzle 394 is located in an area that is outside a half of the radius of the substrate W inside a half of the radius of the substrate W with respect to the center of the substrate W, the second ejection member 390 may supply the second chemical to an outer area of the substrate W while the substrate W is stopped. Further, the second ejection member 390 may discharge the second chemical while the second nozzle 394 is moved between a point corresponding to a half of the radius of the substrate W with respect to the center of the substrate W and an outer end of the substrate W.

When the treatment liquid is discharged to the substrate W, the substrate W is provided while being rotated. Accordingly, the treatment liquid discharged to the substrate W flows to the outside of the substrate W with a centrifugal force. If a sufficient amount of treatment liquid is not supplied to the substrate W when the treatment liquid is supplied to the substrate W through one nozzle, areas that are not covered by the treatment liquid intermittently or continuously may be generated in a central area of the substrate W. Further, if the substrate W is not rotated at a sufficient speed while a sufficient amount of treatment liquid is supplied, time periods for which a central area of the substrate W and an outer area of the substrate W are exposed to the treatment liquid and amount of treatment liquid supplied to the central area of the substrate W and the outer area of the substrate W may be different. The phenomenon deteriorates a treatment quality of the substrate W. Meanwhile, the inventive concept may improve a treatment quality of the substrate W by supplying the first chemical and the second chemical to the first nozzle 384 and the second nozzle 394 for the areas of the substrate W, and may reduce the amount of chemical used for treatment of the substrate W.

A higher centrifugal force is applied to the area to which the second chemical is supplied by the second nozzle 394 as compared with the area to which the first chemical is supplied by the first nozzle 384. Accordingly, a treatment degree of the substrate W by the second chemical discharged from the second nozzle 394 may become different as a reaction time of the substrate W is shortened as compared with the first chemical discharged from the first nozzle 384. Accordingly, the second nozzle 394 may improve a treatment quality of the substrate W by supplying the second chemical in a state that is different from that of the first nozzle 384 to the substrate W. For example; a concentration of the second chemical supplied by the second nozzle 394 may be higher than that of the first chemical supplied by the first nozzle 384. Further; a temperature of the second chemical supplied by the second nozzle 394 may be higher than that of the first chemical supplied by the first nozzle 384. A concentration and a temperature of the second chemical supplied by the second nozzle 394 may be higher than those of the first chemical supplied by the first nozzle 384. Accordingly, the second chemical supplied by the second nozzle 394 may offset degradation of the substrate treatment state according to reduction of a reaction time as the reactivity of the second chemical with the substrate W increases as compared with that of the first chemical supplied by the first nozzle 384.

Figure 4:
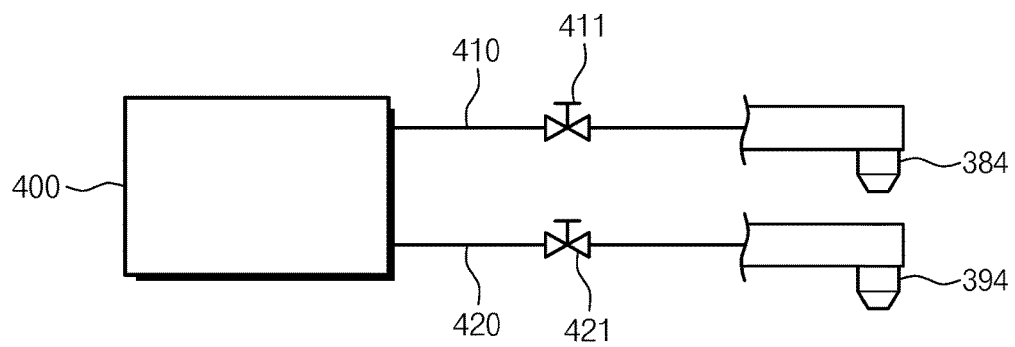
FIG. 4 is a view illustrating a configuration of pipelines connected to a first nozzle and a second nozzle.

FIG. 4 is a view illustrating a configuration of pipelines connected to a first nozzle and a second nozzle.

Referring to FIG. 4, the first nozzle 384 is connected to a tank 400 through a first pipeline 410 and the second nozzle 394 is connected to the tank 400 through a second pipeline 420. The tank 400 supplies a chemical that is to be discharged to the substrate W. A first valve 411 is located in the first pipeline 410, and a second valve 421 is located in the second pipeline 420. Accordingly, the treatment chemicals supplied through the first nozzle 384 and the second nozzle 394 may be the same.

Figure 5:
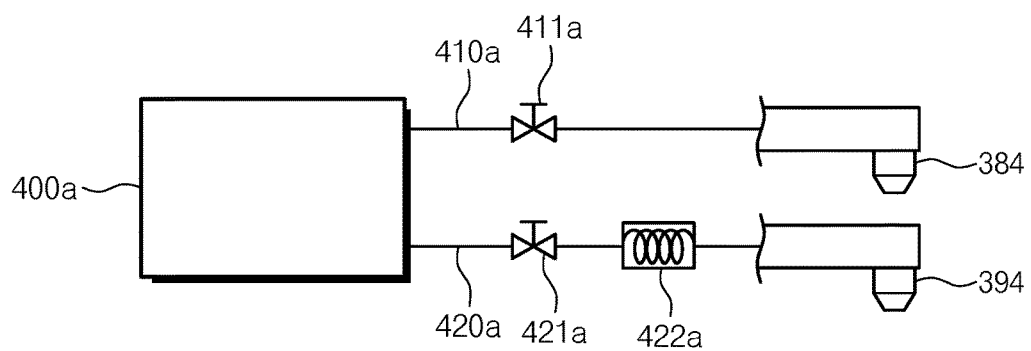
FIG. 5 is a view illustrating a configuration of pipelines connected to a first nozzle and a second nozzle according to a second embodiment.

FIG. 5 is a view illustrating a configuration of pipelines connected to a first nozzle and a second nozzle according to a second embodiment.

Referring to FIG. 5, the first nozzle 384 is connected to a tank 400a through a first pipeline 410a and the second nozzle 394 is connected to the tank 400a through a second pipeline 420a. The tank 400a supplies a chemical that is to be discharged to the substrate W. A first valve 411a is located in the first pipeline 410a, and a second valve 421a and a heater 422a are located in the second pipeline 420a. The heater 422a heats the chemical supplied to the second nozzle 394, and makes the temperature of the chemical discharged from the second nozzle 394 higher than the temperature of the chemical discharged from the first nozzle 384.

Figure 6:
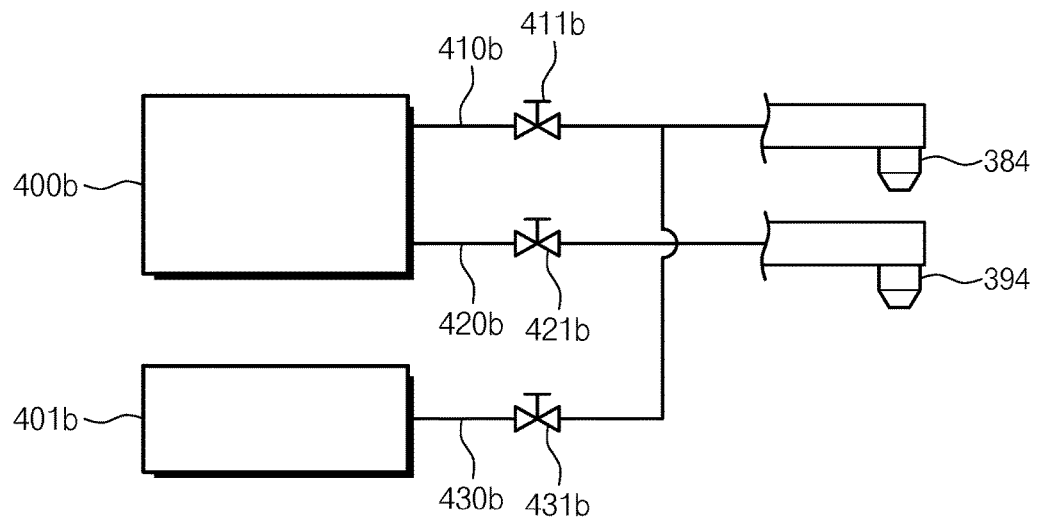
FIG. 6 is a view illustrating a configuration of pipelines connected to a first nozzle and a second nozzle according to a third embodiment.

FIG. 6 is a view illustrating a configuration of pipelines connected to a first nozzle and a second nozzle according to a third embodiment.

Referring to FIG. 6, the first nozzle 384 is connected to a tank 400b through a first pipeline 410 and the second nozzle 394 is connected to the tank 400b through a second pipeline 420b. The tank 400b supplies a chemical that is to be discharged to the substrate W. A first valve 411b is located in the first pipeline 410b, and a second valve 421b is located in the second pipeline 420b. An auxiliary pipeline 430b connects an auxiliary tank 401b and the first pipeline 410b. The auxiliary tank 401b supplies a liquid for lowering a concentration of the chemical. The liquid supplied by the auxiliary tank 401b may be pure water. An auxiliary valve 431b is provided in the auxiliary pipeline 430b. As the liquid supplied by the auxiliary tank 401b is mixed with the chemical, a concentration of the chemical discharged from the first nozzle 384 may become lower than a concentration of the chemical discharged from the second nozzle 394. A heater may be located in the second pipeline 420b as in the embodiment of FIG. 5.

Figure 7:
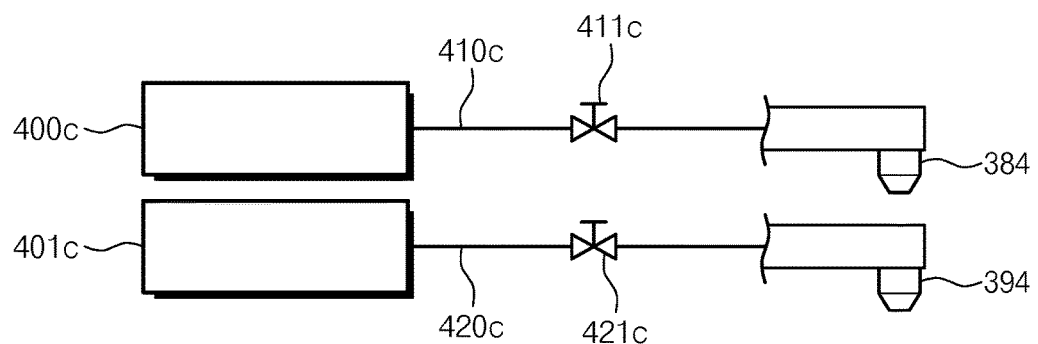
FIG. 7 is a view illustrating a configuration of pipelines connected to a first nozzle and a second nozzle according to a fourth embodiment.

FIG. 7 is a view illustrating a configuration of pipelines connected to a first nozzle and a second nozzle according to a fourth embodiment.

Referring to FIG. 5, the first nozzle 384 is connected to a first tank 400c through a first pipe line 410c and the second nozzle 394 is connected to a second tank 401c through a second pipeline 420c. The first tank 400c and the second tank 401c supply a chemical that is to be discharged to the substrate W. The chemical supplied by the second tank 401c may be a chemical, a temperature of which is higher than that of the chemical supplied by the first tank 400c, a chemical a concentration of which is higher than that of the chemical supplied by the first tank 400c, or a chemical a temperature and a concentration of which are higher than those of the chemical supplied by the first tank 400c. A first valve 411c is located in the first pipeline 410c, and a second valve 421c is located in the second pipeline 420c. A heater may be located in the second pipeline 420c as in the embodiment of FIG. 5.

According to an embodiment of the inventive concept, a substrate treating apparatus that efficiently treats a substrate and a substrate treating method may be provided.

Further, according to an embodiment of the inventive concept, a substrate treating apparatus that uniformly treats an inside and an outside of a substrate and a substrate treating method may be provided.

Further, according to an embodiment of the inventive concept, a substrate treating apparatus that reduce an amount of a chemical consumed for treating a substrate and a substrate treating method may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
a spin head configured to support the substrate;
a cup surrounding an outer circumference of the spin head;
a first ejection member having a first nozzle configured to discharge a first chemical to the substrate located in the spin head;
a second ejection member having a second nozzle configured to discharge a second chemical of the same chemical composition as that of the first chemical to the substrate located in the spin head;
a tank configured to supply first and second chemicals; and
an auxiliary tank configured to store water for lowering the concentration of the first chemical;
wherein the first nozzle is connected to the tank through a first pipeline,
wherein the second nozzle is connected to the tank through a second pipeline, and
wherein the auxiliary tank is connected to the first pipeline through an auxiliary pipeline,
whereby the auxiliary tank supplies the water to the first pipeline for adjusting the concentration of the first chemical lower than that of the second chemical.

2. The substrate treating apparatus of claim 1, wherein the first nozzle discharges the first chemical while being located above the center of rotation of the substrate.

3. The substrate treating apparatus of claim 1, wherein the first nozzle discharges the first chemical while moving in an area that is inside a half of the radius of the substrate.

4. The substrate treating apparatus of claim 3, wherein the first nozzle passes above the center of rotation of the substrate.

5. The substrate treating apparatus of claim 1, wherein the second nozzle discharges the second chemical while being located an area that is outside a half of the radius of the substrate.

6. The substrate treating apparatus of claim 1, wherein the second nozzle discharges the second chemical while moving between an area corresponding to a half of the radius of the substrate and an outer end of the substrate.

7. The substrate treating apparatus of claim 1, wherein a temperature of the second chemical is higher than that of the first chemical.

8. The substrate treating apparatus of claim 1, wherein a heater is located in the second pipeline.

9. A substrate treating apparatus comprising:
a spin head configured to support the substrate;
a cup surrounding an outer circumference of the spin head;

a first ejection member having a first nozzle configured to discharge a first chemical to the substrate located in the spin head;

a second ejection member having a second nozzle configured to discharge a second chemical of the same chemical composition as that of the first chemical to the substrate located in the spin head; and a tank configured to supply first and second chemicals;

wherein the first nozzle is connected to the tank through a first pipeline, wherein the second nozzle is connected to the tank through a second pipeline, and wherein a heater is located in the second pipeline, whereby the heater heats the second chemical for heating a temperature of the second chemical higher than that of the first chemical.

\* \* \* \* \*